United States Patent
Lynch

(10) Patent No.: US 7,034,619 B2
(45) Date of Patent: Apr. 25, 2006

(54) MONOLITHIC ARRAY AMPLIFIER WITH PERIODIC BIAS-LINE BYPASSING STRUCTURE AND METHOD

(75) Inventor: Jonathan Lynch, Oxnard, CA (US)

(73) Assignee: Raytheon Company, Waltham, MA (US)

( * ) Notice: Subject to any disclaimer, the term of this patent is extended or adjusted under 35 U.S.C. 154(b) by 53 days.

(21) Appl. No.: 10/664,112

(22) Filed: Sep. 17, 2003

(65) Prior Publication Data

US 2005/0057310 A1    Mar. 17, 2005

(51) Int. Cl.
*H03F 3/68* (2006.01)
(52) U.S. Cl. .................................. 330/295; 330/124 R
(58) Field of Classification Search ............... 330/295, 330/124 R, 84, 307
See application file for complete search history.

(56) References Cited

U.S. PATENT DOCUMENTS

| | | | | |
|---|---|---|---|---|
| 4,074,151 A | * | 2/1978 | Buckley et al. | ............... 327/87 |
| 4,553,053 A | * | 11/1985 | Ong et al. | ..................... 327/54 |
| 4,631,493 A | | 12/1986 | Vendelin et al. | |
| 6,081,160 A | | 6/2000 | Custer et al. | |
| 6,137,377 A | * | 10/2000 | Wallace et al. | ............. 333/139 |
| 6,177,841 B1 | | 1/2001 | Ohta et al. | |
| 6,300,835 B1 | | 10/2001 | Seely et al. | |

* cited by examiner

*Primary Examiner*—Henry Choe
(74) *Attorney, Agent, or Firm*—Thomas J. Finn; Leonard A. Alkov; Karl A. Vick

(57) ABSTRACT

A bias-line bypassing structure comprises a plurality of bias-line bypass circuits forming a periodic structure at least partially around each of a plurality of amplification units to reduce RF current flow between the amplification units and a grid-bias network. Each bias-line bypass circuit may comprise thin-film capacitors, inductive wire bridges, and thin-film resistors connected to ground vias. The thin-film capacitors may have differing values selected to resonate with an associated one of the inductive wire bridges and an associated one of the thin-film resistors to shunt RF current flow over a range of RF frequencies. In some embodiments, the inductive wire bridges may comprise inductive wire-bridge fuses to provide an open circuit in case an associated one the thin-film capacitors shorts to ground. The bias-line bypass circuits may be positioned along a bias street of the grid-bias network and spaced apart by less than a quarter-wavelength of an effective propagation constant of the bias line.

27 Claims, 3 Drawing Sheets

MONOLITHIC ARRAY AMPLIFIER WITH PERIODIC BIAS-LINE BYPASSING STRUCTURE AND METHOD

TECHNICAL FIELD

Embodiments of the present invention pertain to RF circuitry, and some embodiments pertain to monolithic amplifier arrays and biasing for such monolithic amplifier arrays.

BACKGROUND

Conventionally, monolithic circuits, including MMIC amplifiers, are fabricated on a semiconductor wafer, diced up into a large number of individual circuits and mounted onto RF substrates. Each RF substrate may be individually biased and may include large bypass capacitors to reduce the amount of RF energy on the bias lines for each substrate. Instead of being diced up into separate individual circuits, monolithic arrays may include a large number of monolithic circuits on a single RF semiconductor substrate. One problem with these conventional bias-line bypassing techniques for monolithic arrays is that the bypass capacitors required do not fit within the limited space available on a wafer.

Some conventional bias-line bypassing techniques use a number of different size capacitors to provide bypassing over a wide frequency range. Large capacitors used to bypass low frequencies, do not always fit within the limited available space, and it may become necessary to distribute a larger number of capacitors around a bias line. Unfortunately, a larger number of capacitors increases the probability that defective capacitors may short to ground causing the circuit to become inoperable.

Thus, there are general needs for improved bias-line bypassing techniques for monolithic arrays. There are also needs for bias-line bypassing techniques that reduce the risk and problems associated with capacitor failure.

SUMMARY

A bias-line bypassing structure comprises a plurality of bias-line bypass circuits forming a periodic structure at least partially around each of a plurality of amplification units to reduce RF current flow between the amplification units and a grid-bias network. Each bias-line bypass circuit may comprise thin-film capacitors, inductive wire bridges, and thin-film resistors connected to ground vias. The thin-film capacitors may have differing values selected to resonate with an associated one of the inductive wire bridges and an associated one of the thin-film resistors to shunt RF current flow over a range of RF frequencies. In some embodiments, the inductive wire bridges may comprise inductive wire-bridge fuses to provide an open circuit in case an associated one the thin-film capacitors shorts to ground. The bias-line bypass circuits may be positioned along a bias street of the grid-bias network and spaced apart by less than a quarter-wavelength of an effective propagation constant of the bias line. In some embodiments, a plurality of amplification units may be arranged in a grid-like structure fabricated on a single monolithic substrate to form an array amplifier. The semiconductor material may comprise, for example, Indium-Phosphide (InP), Gallium Arsenide (GaAs), Gallium Nitride (GaN), or Silicon (Si).

BRIEF DESCRIPTION OF THE DRAWINGS

The appended claims are directed to some of the various embodiments of the present invention. However, the detailed description presents a more complete understanding of embodiments of the present invention when considered in connection with the figures, wherein like reference numbers refer to similar items throughout the figures and:

DETAILED DESCRIPTION

The following description and the drawings illustrate specific embodiments of the invention sufficiently to enable those skilled in the art to practice them. Other embodiments may incorporate structural, logical, electrical, process, and other changes. Examples merely typify possible variations. Individual components and functions are optional unless explicitly required, and the sequence of operations may vary. Portions and features of some embodiments may be included in or substituted for those of others. The scope of embodiments of the invention encompasses the full ambit of the claims and all available equivalents of those claims.

Figure 1:
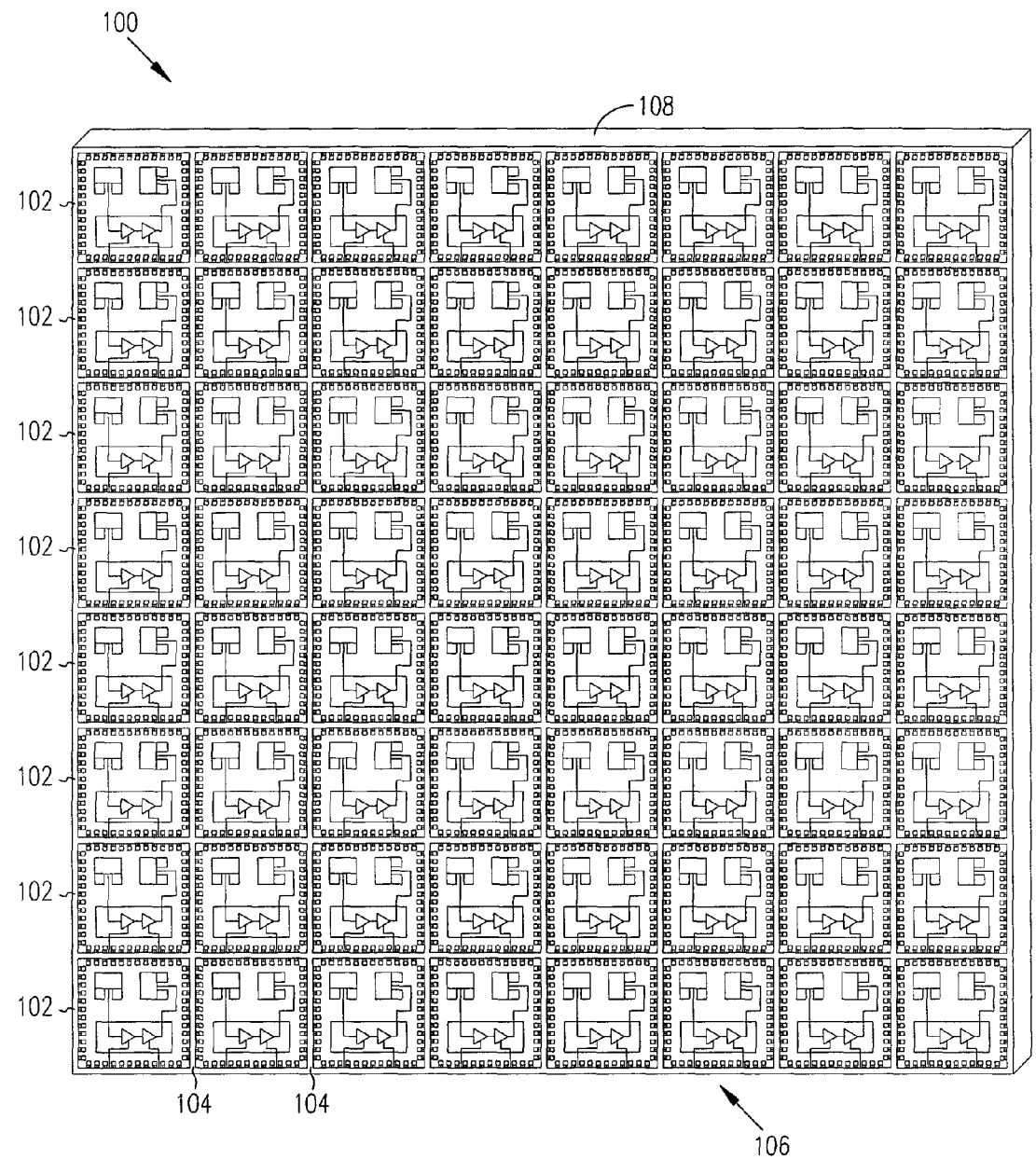
FIG. 1 illustrates a portion of a monolithic array amplifier in accordance with embodiments of the present invention.

FIG. 1 illustrates a portion of a monolithic array amplifier in accordance with embodiments of the present invention. Monolithic array amplifier 100 comprises a plurality of amplification units 102 arranged in grid-like structure 106 and fabricated on single monolithic substrate 108. Array amplifier 100 also includes grid-bias network 104 separating amplification units 102 and providing DC power to amplification units 102. In accordance with embodiments, each amplification unit 102 comprises bias-line bypass circuits (discussed in more detail below) which form a periodic structure. Grid-bias network 104 may be viewed as a power-grid mesh.

In some embodiments the bias-line bypass circuits are positioned along a bias street of grid-bias network 104 and spaced apart by less than a quarter-wavelength of an effective propagation constant (e.g., the effective permittivity) of the bias line. The semiconductor material may comprise Indium-Phosphide (InP), Gallium Arsenide (GaAs), Gallium Nitride (GaN), or Silicon (Si), for example.

Although units 102 are described herein as amplification units, this is not a requirement. Units 102 may comprise almost any circuitry that receives bias from bias-grid network 104. In some embodiments, each amplification unit 102 may comprise one or more power amplifiers which receive bias current from the grid-bias network 104. In some embodiments, the power amplifiers comprise a self-biased amplifier such as a self-biased high-electron-mobility transistor (HEMT) amplifier, although the scope of the invention is not limited in this respect. In these embodiments, a single bias voltage may be provided by grid-bias network 104 for both the gate and drain of the transistors and a resistive element may be used to adjust/lower the gate voltage.

Although FIG. 1 illustrates an array amplifier, embodiments of the present invention are equally suitable to any grid-like structure of circuit elements. For example, in embodiments, bias-line bypassing structure 106 may comprise a plurality of bias-line bypass circuits positioned in a periodic structure at least partially around grid units which include circuit elements to reduce RF current flow between the circuit elements and grid-bias network 104 for providing bias current to the circuit elements. In these embodiments, the circuit elements may include almost any type of active circuit element including amplification units, power amplifiers, etc.

In some embodiments, amplification units 102 may include receive antennas, transmit antennas and power amplifiers to receive a bias voltage from grid-bias network 104 and to amplify RF signals received by the receive antennas for re-transmission by the transmit antennas. In some embodiments, the RF signals may be at millimeter-wave frequencies, and in some embodiments, the RF signals may be W-band RF signals. In some embodiments, structure 106 may be part of an amplifier reflect-array for reception, amplification and retransmission of a millimeter wave frequency approximately in a range between 90 and 100 GHz. In some embodiments, the receive antennas may be configured to receive a substantially vertically-polarized wavefront at a millimeter-wave frequency, the power amplifiers may be configured to amplify signals to provide a substantially horizontally-polarized wavefront. The transmit antennas may be configured to re-transmit the amplified signals to generate the high-power collimated wavefront at the millimeter-wave frequency, although the scope of the invention is not limited in this respect.

Figure 2:
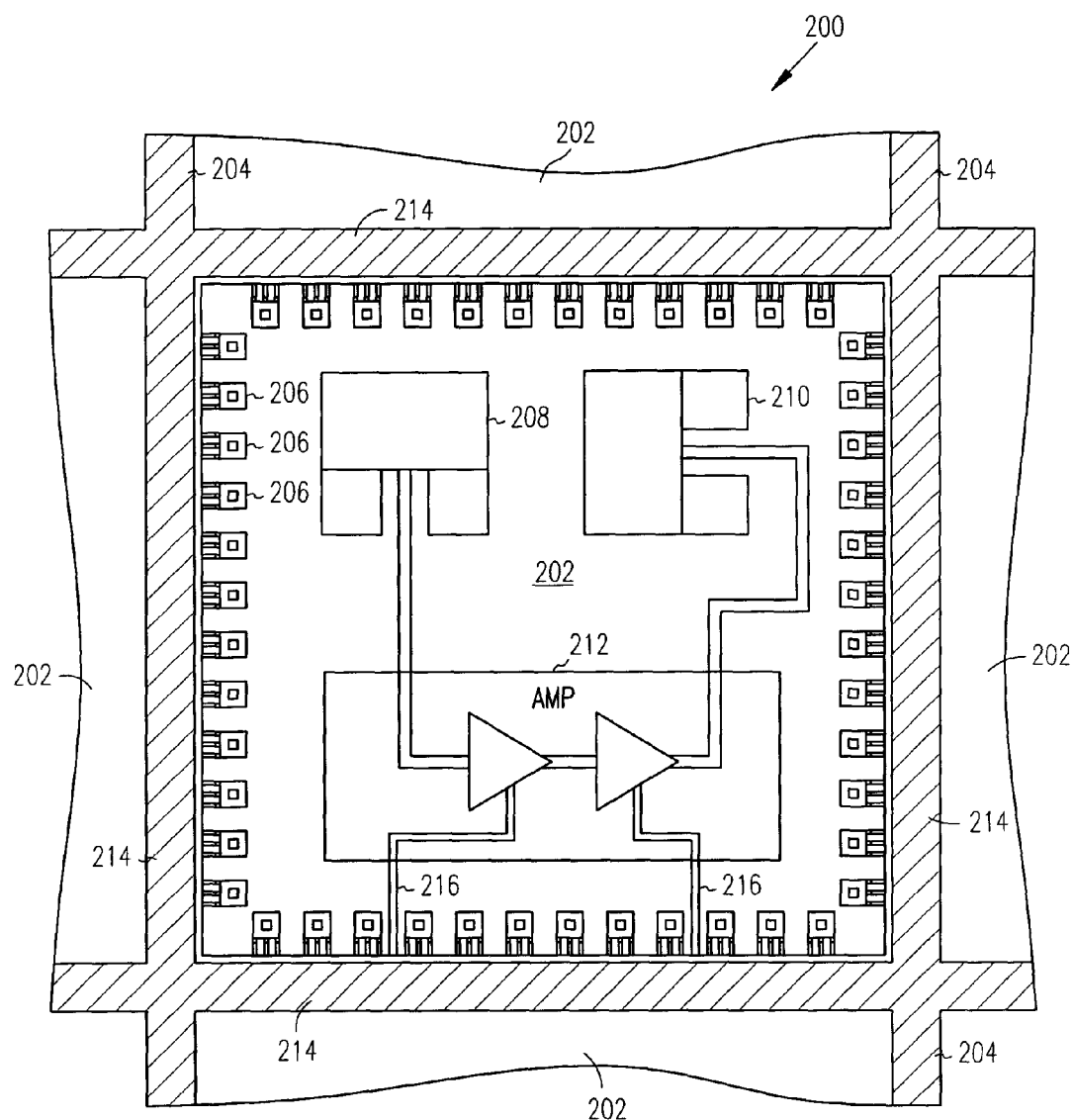
FIG. 2 illustrates an amplification unit in accordance with embodiments of the present invention.

FIG. 2 illustrates a portion of a grid-like structure including an amplification unit in accordance with embodiments of the present invention. In embodiments, portion 200 may be a grid unit of array amplifier 100 (FIG. 1), although other grid units may also be suitable. Portion 200 may include one or more amplification units 202 separated by bias streets 214 of grid-bias network 204. Amplification units 202 may be suitable for use as one of amplification units 102 (FIG. 1) although other circuit elements may also be suitable. Grid-bias network 204 may provide DC power to amplification units 202. In embodiments, each amplification unit 202 comprises bias-line bypass circuits 206, which may form a periodic structure. Bias-line bypass circuits 206 may be positioned along bias streets 214 of grid-bias network 204 to reduce RF current flow between amplification unit 202 and grid-bias network 204. In some embodiments, a plurality of bias-line bypass circuits 206 may be positioned at least partially or substantially around each amplification unit 202 to further reduce RF current flow between amplification unit 202 and grid-bias network 204.

In some embodiments, each bias-line bypass circuit 206 may comprise a periodic structure of resistive-inductive-capacitance (RLC) networks. In these embodiments, bias-line bypass circuits 206 may be positioned along bias streets 214 of grid-bias network 204 and may have a spacing therebetween of less than a quarter-wavelength of an effective propagation constant of the bias line.

In some embodiments, amplification units 202 may include receive antenna 208, transmit antenna 210 and power amplifier 212. Power amplifier 212 may receive a bias voltage through bias lines 216 from grid-bias network 204. In these embodiments, power amplifier 212 may be configured to amplify RF signals, such as millimeter wave signals, received by the receive antenna for transmission by the transmit antenna. In these embodiments, when configured in an array, each amplification unit 202 may operate independently of other amplification units 202 of array 100 (FIG. 1) at least from an RF perspective.

In some embodiments, grid-bias network 204 may comprise a mesh structure comprising one or more conductors, such as gold, having a thickness of approximately between 20 and 30 microns (μm) and a width between approximately 200 and 400 microns (μm), although the scope of the invention is not limited in this respect. In these embodiments, the thickness may be selected depending on the current requirements of amplification units 202 and to reduce any voltage sag within the mesh structure. In other embodiments, other grid-bias network 204 may comprise other conductors. In some embodiments, a power source may provides up to 300 amps or greater of current to the grid-bias network, although the scope of the invention is not limited in this respect.

Figure 3:
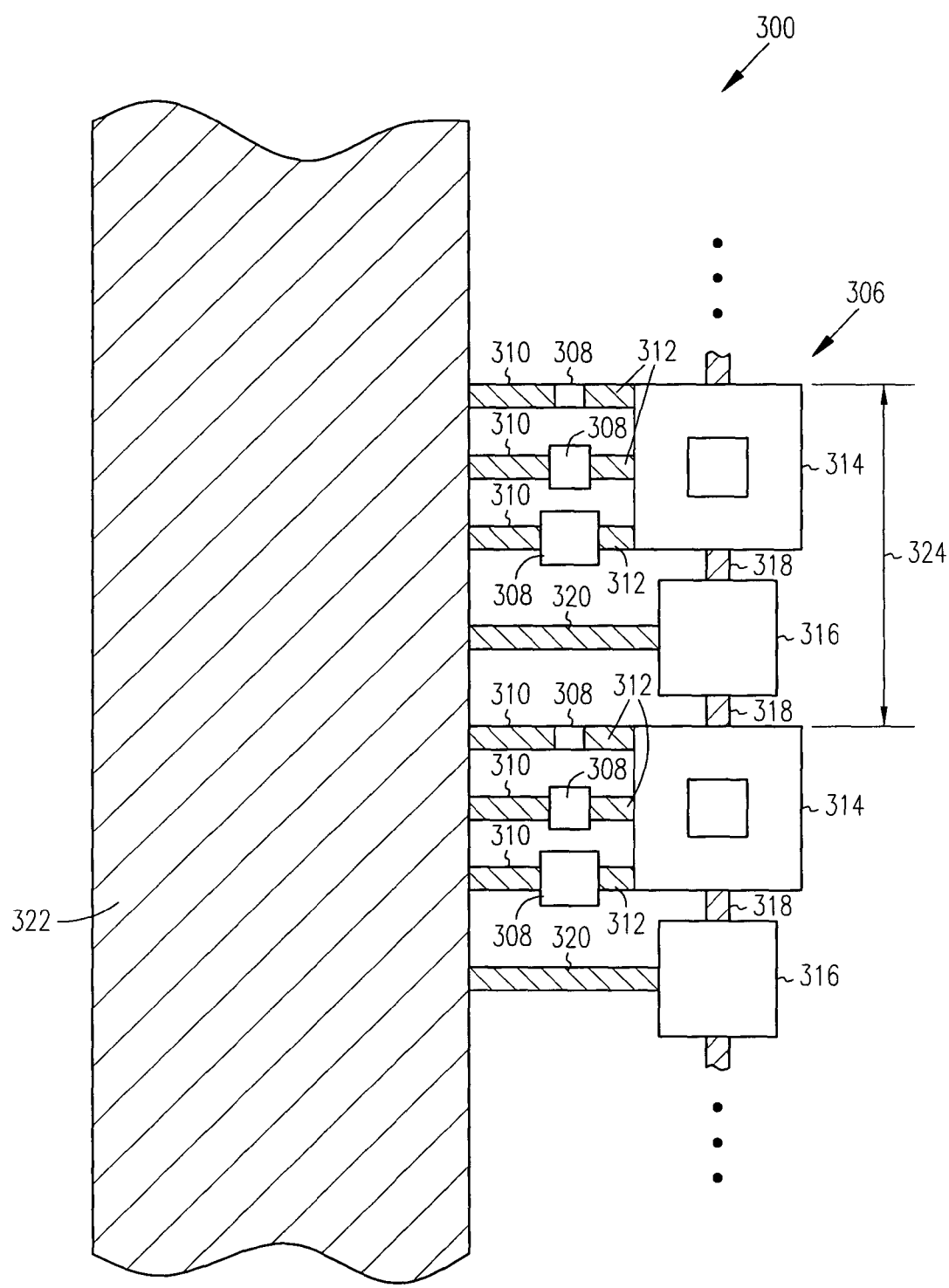
FIG. 3 illustrates a bias-line bypassing structure in accordance with embodiments of the present invention.

FIG. 3 illustrates a bias-line bypassing structure in accordance with embodiments of the present invention. Bias-line bypassing structure 300 may be suitable to decouple amplification units 202 (FIG. 2) from grid-bias network 204, although other structures may also be suitable. Bias-line bypassing structure 300 may comprise a periodic network of bias-line bypass circuits 306 which may be suitable for use as bias-line bypass circuitry 206 (FIG. 2) although other circuitry may also be suitable. In accordance with embodiments, bias-line bypass circuits 306 may form a periodic structure of resistive-inductive-capacitance (RLC) networks. Each bypass circuit 306 may comprise one or more thin-film capacitors 308, and one or more inductive wire bridges 310 coupling one or more of capacitors 308 to bias street 322 of a grid-bias network. Each bypass circuit 306 may also comprise one or more thin-film resistors 312 coupling capacitors 308 to ground vias 314. In embodiments, capacitors 308 may have differing values selected to resonate with an associated one of inductive wire bridges 310 and an associated one of thin-film resistors 312 to shunt RF current flow over a range of RF frequencies. In some embodiments, the range of RF frequencies may include RF frequencies from up to 300 GHz. In some embodiments, the range of RF frequencies may include millimeter-wave frequencies.

In some embodiments, bias-line bypassing structure 300 may comprise thin-film capacitors 316 coupled between more than one of ground vias 314 with thin-film resistors 318. Capacitors 316 may be further coupled with bias street 322 by inductive wire bridges 320.

In some embodiments, inductive wire bridges 310 and 320 may comprise inductive wire-bridge fuses. The wire-bridge fuses may provide an open circuit when/if an associated one of thin-film capacitors 308, 316 shorts to ground. This may occur during a failure mode of a thin-film capacitor. In those embodiments when a plurality of bias-line bypass circuits 306 are provided for an amplification unit, the failure of a some of these thin-film capacitors may have little or no impact on the units performance. In some embodiments, capacitors 308 and 316 may have values ranging between approximately 0.05 pf and 10.0 pf, although the scope of the invention is not limited in this respect. Thin-film resistors 312 may have values ranging from a couple ohms to up to 10 Ohms and greater.

In some embodiments, each bias-line bypass circuit 306 may be part of periodic structure 300 of resistive-inductive-capacitance (RLC) networks. In these embodiments, bias-line bypass circuits 306 may be positioned along bias streets 322 of the grid-bias network and may have spacing 324 therebetween. Spacing 324 may be less than a quarter-wavelength of an effective propagation constant of the bias line, although the scope of the invention is not limited in this respect. In embodiments that include an InP substrate, spacing 324 may be approximately between 50 and 200 microns (μm). For W-band operation, spacing 324 may be around 150 microns.

In some embodiments, the present invention provides a method of decoupling a bias structure (e.g., structure 106 (FIG. 1)) in a monolithic array amplifier (e.g., array amplifier 100 (FIG. 1)). In these embodiments, the method comprises arranging a plurality of amplification units in a grid-like structure on a single monolithic substrate. The amplification unit may be separated by a grid-bias network for providing DC power to the amplification units. In these embodiments, the method also comprises positioning bias-line bypass circuits (e.g., circuits 306 (FIG. 3)) in a periodic structure (e.g., structure 300 (FIG. 3)) of RLC networks at least partially around an associated amplification unit to help reduce RF current flow between the amplification unit and the grid-bias network.

In some alternate embodiments, a method of decoupling a bias structure (e.g., structure 106 (FIG. 1)) in a monolithic array amplifier (e.g., array amplifier 100 (FIG. 1)) comprises providing DC power to a plurality of amplification units arranged in a grid-like structure with a grid-bias network separating the amplification units. In these alternate embodiments, the method also comprises reducing RF current flow between the amplification units and the grid-bias network with a periodic structure (e.g., structure 300 (FIG. 3)) of bias-line bypass circuits (e.g., circuits 306 (FIG. 3) within each of the amplification units.

Thus, methods and improved bias-line bypassing techniques for monolithic arrays have been described. Also, methods and bias-line bypassing techniques that reduce the risk and problems associated with capacitor failure have been described.

It is emphasized that the Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims.

In the foregoing detailed description, various features are occasionally grouped together in a single embodiment for the purpose of streamlining the disclosure. This method of disclosure is not to be interpreted as reflecting an intention that the claimed embodiments of the subject matter require more features that are expressly recited in each claim. Rather, as the following claims reflect, inventive subject matter lies in less than all features of a single disclosed embodiment. Thus the following claims are hereby incorporated into the detailed description, with each claim standing on its own as a separate preferred embodiment.

What is claimed is:

1. A monolithic array amplifier comprising:
   a plurality of amplification units arranged in a grid-like structure on a monolithic substrate; and
   a grid-bias network separating the amplification units to provide DC power to the amplification units,
   wherein each amplification unit comprises bias-line bypass circuits in a periodic structure,
   wherein each bias-line bypass circuit includes resistive-inductive-capacitance networks comprising:
   thin-film capacitors;
   inductive wire bridges coupling the capacitors to bias streets of the grid-bias network; and
   thin-film resistors coupling the capacitors to ground vias.

2. The array amplifier of claim 1 wherein each bias-line bypass circuit is positioned along bias streets of the grid-bias network and the bias-line bypass circuits are positioned at least partially around each amplification unit within a grid unit to reduce RF current flow between an associated one of the amplification units and the grid-bias network.

3. The array amplifier of claim 1 wherein the capacitors of each bias line circuit have differing values selected to resonate with the inductive wire bridges and the thin-film resistors to shunt RE current flow over a range of RF frequencies.

4. The array amplifier of claim 1 further comprising second thin-film capacitors coupled between more than one ground vias with second thin-film resistors, and further coupled with the grid-bias network with second inductive wire bridges.

5. The array amplifier of claim 1 wherein the inductive wire bridges comprise inductive wire-bridge fuses, the fuses to provide an open circuit when an associated one the thin-film capacitors shorts to ground.

6. A monolithic array amplifier comprising:
   a plurality of amplification units arranged in a grid-like structure on a monolithic substrate; and
   a grid-bias network separating the amplification units to provide DC power to the amplification units,
   wherein each amplification unit comprises bias-line bypass circuits in a periodic structure,
   wherein the monolithic substrate comprises a semiconductor material, and wherein the bias-line bypass circuits are positioned along a bias street of the grid-bias network and spaced apart by less than a quarter-wavelength of an effective propagation constant of the bias street, and
   wherein the semiconductor material comprises a material selected from the group consisting of Indium-Phosphide (JnP), Gallium Arsenide (GaAs), Gallium Nitride (GaN), and Silicon (Si).

7. The array amplifier of claim 6 wherein each amplification unit comprises a power amplifier which receives a bias voltage from the grid-bias network.

8. The array amplifier of claim 6 wherein the power amplifier comprises a self-biased high-electron-mobility transistor (HEMT) amplifier.

9. The array amplifier of claim 6 wherein at least some of the amplification units of the plurality comprise:
   a receive antenna on the substrate;
   a transmit antenna on the substrate; and
   a power amplifier to receive a bias voltage from the grid-bias network and to amplify millimeter-wave frequencies received by the receive antenna for transmission by the transmit antenna.

10. A monolithic array amplifier comprising:
    a plurality of amplification units arranged in a grid-like structure on a monolithic substrate; and
    a grid-bias network separating the amplification units to provide DC power to the amplification units,
    wherein each amplification unit comprises bias-line bypass circuits in a periodic structure,
    wherein at least some of the amplification units of the plurality comprise:
    a receive antenna;
    a transmit antenna; and
    a power amplifier to receive a bias voltage from the grid-bias network and to amplify millimeter-wave frequencies received by the receive antenna for transmission by the transmit antenna, and
    wherein the receive antennas are configured to receive a substantially vertically-polarized wavefront at a millimeter-wave frequency, the power amplifiers are configured to amplify signals to provide a substantially horizontally-polarized wavefront, and the transmit antennas are configured to transmit the amplified signals to generate the high-power collimated wavefront at the millimeter-wave frequency.

11. The array amplifier of claim 1 wherein the grid-bias network comprises a mesh structure comprising gold having a thickness of approximately between 20 and 30 microns and a width between approximately 200 and 400 microns,
wherein a power source provides up to 300 amps of current to the grid-bias network, and wherein the capacitors range between approximately 0.05 pf and 10.0 pf.

12. A method of decoupling a bias structure in a monolithic array amplifier comprising:
providing DC power to a plurality of amplification units arranged in a grid-like structure with a grid-bias network separating the amplification units; and
reducing RF current flow between the amplification units and the grid-bias network with a periodic structure of bias-line bypass circuits within each of the amplification units,
wherein reducing comprises shunting RF current flow over a range of RF frequencies with a plurality of RLC networks that comprise each bias-line bypass circuit, each bias-line bypass circuit comprising thin-film capacitors, inductive wire bridges coupling the capacitors to bias streets of the grid-bias network, and thin-film resistors coupling the capacitors to ground vias, wherein the capacitors of each bias line circuit have differing values selected to resonate with an associated one of the thin-film resistors and an associated one of the inductive wire bridges.

13. The method of claim 12 further comprising:
providing second thin-film capacitors between more than one of the ground vias, the second thin-film capacitors coupled to the more than one of the ground vias with second thin-film resistors; and
providing second inductive wire bridges coupling the second thin-film capacitors with the grid-bias network.

14. The method of claim 12 wherein the inductive wire bridges comprise inductive wire-bridge fuses, and the method further comprises providing an open circuit with the inductive wire-bridge fuses when an associated one the thin-film capacitors shorts to ground.

15. A method of decoupling a bias structure in a monolithic array amplifier comprising:
providing DC power to a plurality of amplification units arranged in a grid-like structure on a monolithic semiconductor substrate with a grid-bias network separating the amplification units; and
reducing RF current flow between the amplification units and the grid-bias network with a periodic structure of bias-line bypass circuits within each of the amplification units,
wherein the monolithic substrate comprises a semiconductor material, and wherein reducing comprises positioning the bias-line bypass circuits along a bias street of the grid-bias network to have a spacing of less than a quarter-wavelength of an effective propagation constant of the bias street.

16. The method of claim 12 wherein at least some amplification units of the plurality comprise a receive antenna on the monolithic substrate, a transmit antenna on the monolithic substrate, and a power amplifier on the monolithic substrate.

17. The method of claim 16 further comprising:
providing each power amplifier with a bias voltage from the grid-bias network; and
amplifying millimeter wave signals received by the receive antenna for retransmission by the transmit antenna.

18. A bias-line bypassing structure comprising a plurality of bias-line bypass circuits positioned in a periodic structure at least partially around each of a plurality of circuit elements to reduce RF current flow between the circuit elements and a grid-bias network for providing bias current to the circuit elements,
wherein each bias-line bypass circuit comprises thin-film capacitors, inductive wire bridges coupling the capacitors to bias streets of the grid-bias network, and thin-film resistors coupling the capacitors to ground vias, wherein the capacitors have differing values selected to resonate with an associated one of the inductive wire bridges and an associated one of the thin-film resistors to shunt RF current flow over a range of RF frequencies.

19. The structure of claim 18 wherein the inductive wire bridges comprise inductive wire-bridge fuses, the fuses to provide an open circuit when an associated one the thin-film capacitors shorts to ground.

20. The structure of claim 18 wherein the plurality of circuit elements are arranged in a grid-like structure and fabricated on a single monolithic substrate, the plurality of circuit elements and the bias-line bypass circuits being within grid units separated by bias streets which form the structure.

21. The structure of claim 19 wherein the grid-bias network is power-grid mesh separating the circuit elements for providing DC power to the circuit elements.

22. The structure of claim 18 wherein the bias-line bypass circuits further comprise second thin-film capacitors coupled between more than one ground vias with second thin-film resistors, and coupled with the grid-bias network with second inductive wire bridges.

23. The structure of claim 20 wherein the monolithic substrate comprises a semiconductor material, and wherein the bias-line bypass circuits are positioned along the bias streets of the grid-bias network and spaced apart by less than a quarter-wavelength of an effective propagation constant of the bias street.

24. The structure of claim 23 wherein the semiconductor material comprises a material selected from the group consisting of Indium-Phosphide (InP), Gallium Arsenide (GaAs), Gallium Nitride (GaN), and Silicon (Si).

25. The structure of claim 18 wherein each circuit element comprises a receive antenna, a transmit antenna, and a power amplifier to receive a bias voltage from the grid-bias network and to amplify a millimeter wave signals received by the receive antenna for re-transmission by the transmit antenna.

26. The structure of claim 18 wherein the grid-bias network comprises a mesh structure comprised of gold having a thickness of approximately between 20 and 30 microns and a width between approximately 200 and 400 microns.

27. The structure of claim 26 wherein a power source provides up to 300 amps of current to the grid-bias network, and wherein the capacitors range between approximately 0.05 pf and 10.0 pf.

* * * * *